United States Patent
Matsuoka

(10) Patent No.: US 7,933,735 B2
(45) Date of Patent: Apr. 26, 2011

(54) SEMICONDUCTOR INTEGRATED CIRCUIT

(75) Inventor: Toshihiko Matsuoka, Nukata-gun (JP)

(73) Assignee: DENSO CORPORATION, Kariya (JP)

( * ) Notice: Subject to any disclaimer, the term of this patent is extended or adjusted under 35 U.S.C. 154(b) by 620 days.

(21) Appl. No.: 12/010,757

(22) Filed: Jan. 29, 2008

(65) Prior Publication Data

US 2008/0183416 A1 Jul. 31, 2008

(30) Foreign Application Priority Data

Jan. 31, 2007 (JP) .................................. 2007-021253
Aug. 27, 2007 (JP) .................................. 2007-219746

(51) Int. Cl.
*G01R 31/14* (2006.01)
(52) U.S. Cl. ........................ 702/119; 702/120; 324/527
(58) Field of Classification Search .................. 702/117, 702/119, 120, 123, 125; 324/500, 527, 535, 324/555
See application file for complete search history.

(56) References Cited

U.S. PATENT DOCUMENTS

| | | | | |
|---|---|---|---|---|
| 5,673,273 A | * | 9/1997 | Almy ........................... | 714/724 |
| 6,324,669 B1 | * | 11/2001 | Westby ........................ | 714/805 |
| 2004/0107396 A1 | * | 6/2004 | Barone et al. ................ | 714/733 |
| 2006/0009252 A1 | | 1/2006 | Iida et al. | |

FOREIGN PATENT DOCUMENTS

| | | |
|---|---|---|
| JP | A-5-36904 | 2/1993 |
| JP | A-H8-063450 | 3/1996 |
| JP | A-2002-318264 | 10/2002 |
| JP | A-2004-333246 | 11/2004 |
| JP | A-2007-58659 | 3/2007 |

OTHER PUBLICATIONS

Office Action dated Jan. 9, 2009 in corresponding JP application No. 2007-219746 (and English Translation).

* cited by examiner

*Primary Examiner* — Manuel L Barbee
(74) *Attorney, Agent, or Firm* — Posz Law Group, PLC

(57) ABSTRACT

A semiconductor integrated circuit having a test circuit for collecting test data at any time based on interaction with an external source is provided. A communication circuit receives a data frame that is transferred to a data buffer. Data portions are transferred to a test unit of a test circuit. A counter starts a count operation based on a system clock when count information is transferred. If one of the data portions indicates the transferred data is test data, and another portion indicates a data collection specification command, the test unit outputs decoded address data to interact with a circuit-under-test when the counter completes the count operation based on another portion of the frame. A data buffer is supplied with the address data to facilitate storage of the data transferred from the circuit-under-test.

13 Claims, 10 Drawing Sheets

SEMICONDUCTOR INTEGRATED CIRCUIT

CROSS-REFERENCE TO RELATED APPLICATIONS

The present application is based on and claims priority to unpublished Japanese Patent Application No. 2007-021253 filed on Jan. 31, 2007 and unpublished Japanese Patent Application No. 2007-219746 filed on Aug. 27, 2007, the entire contents of both of which are incorporated herein by reference.

BACKGROUND OF THE INVENTION

1. Field of the Invention

The present invention relates to a semiconductor integrated circuit having a test circuit and more specifically to collecting test data associated with an internal function based on data received from an external source via a communication circuit.

2. Description of Related Art

A microcomputer is normally provided with a test mode as one of potentially many modes of operation. The typical conventional test mode is used to execute a test program for testing circuit functions of the microcomputer. For example, as described in JP-1993-36904 A, the use of serial communication for collecting or configuring data associated with a test is known.

Generally, the serial communication is used to collect data from a communication destination as follows. The communication destination receives communication data containing a command that requests data collection. The destination collects data stored in a targeted circuit at the time the command is received or thereabouts and returns the data. Basically, the communication destination can only collect data stored in the targeted circuit at the time when the command is received and at no other time. Accordingly, it is difficult or impossible in such a conventional situation to collect data generated at various times other than the time when the command is received.

SUMMARY OF THE INVENTION

The present invention has been made in consideration of the foregoing. It is therefore an object of the invention to provide a semiconductor integrated circuit having a test circuit that enables a user to collect test data at any time.

In a semiconductor integrated circuit in accordance with one exemplary embodiment, a communication circuit receives data that is then transferred to a data buffer. The transferred data can include data blocks, data portions, data segments or the like, such as a HEADER portion, an ADDRESS portion, and a COMMAND portion, which are transferred to a test execution unit of a test circuit. When a CYCLE portion of the transferred data is transferred, a counter starts a count operation based on a system clock. The HEADER portion may indicate that the transferred data is test data, while the COMMAND portion may indicate the actual command name, such as the command "data collection specification." It will be appreciated that the COMMAND portion can also include a command code value or index value that corresponds to the command in a manner similar to a command name.

When the counter completes the count operation, the test execution unit outputs a decode result based on the ADDRESS portion that serves as a collection enable signal to a circuit-under-test, such as by identifying the circuit using the address data. A data buffer is supplied with the collection enable signal to store data transferred from the circuit-under-test. A "redundancy" portion contains data signifying an error checking result provided during a communication process for receiving a test frame. When the error check result shows an error, the HEADER, ADDRESS, COMMAND, DATA, and CYCLE portions are not transferred to the test circuit and may be discarded.

Assuming that test data is transmitted to the semiconductor integrated circuit from an external source, the data buffer stores data contained in the circuit-under-test upon expiration of a time interval between the data transmission and completion of the above described count operation. When the counter is supplied with appropriately configured CYCLE portion data, the transmission data buffer can store data that reflects operation states at various times of the circuit-under-test. The test circuit is constructed independently of the communication circuit. While the communication circuit is performing communication not directly related to the test, the test circuit can acquire test data at any time.

In the semiconductor integrated circuit in accordance with another exemplary embodiment, the test execution unit transfers data stored in the data buffer to the communication circuit when the COMMAND portion indicates "data collection execution." When the semiconductor integrated circuit is supplied with a "data collection execution" command from an external source, the data stored in the data buffer can be acquired via the communication circuit.

In the semiconductor integrated circuit in accordance with another exemplary embodiment, the test execution unit outputs a decode result based on the ADDRESS portion as a configuration enable signal to a circuit-under-test and outputs a data content in the transfer data to the circuit-under-test for configuration upon completion of the counter's count operation when the COMMAND portion indicates "data configuration." When test data is supplied to a circuit-under-test from an external source, data can be configured at various times by supplying the counter with appropriately configured CYCLE portion data.

In the semiconductor integrated circuit in accordance with another exemplary embodiment, the communication circuit can be selected as the circuit-under-test. The communication circuit's function can be also tested by acquiring or configuring data.

In the semiconductor integrated circuit in accordance with another exemplary embodiment, a data buffer of the test circuit is constructed as first-in-first-out (FIFO). It is thereby possible to successively acquire multiple pieces of data from a circuit-under-test or successively allocate multiple pieces of data to the circuit-under-test, thus improving test efficiency.

In the semiconductor integrated circuit in accordance with another exemplary embodiment, a communication transceiver is included that uses a common signal line and transmits and receives data for the communication circuit to perform serial communication with an external source. It is possible to use a common signal line for the bidirectional communication and reduce the number of signal lines.

In the semiconductor integrated circuit in accordance with another exemplary embodiment, the communication transceiver is constructed to use one signal line for serial communication with an external source. The number of signal lines for the bidirectional communication can be minimized.

In the semiconductor integrated circuit in accordance with another exemplary embodiment, the test circuit outputs the mode configuration data contained in the received data frame to the mode determination circuit when the HEADER portion indicates a "mode configuration." The mode determination circuit decodes supplied data and outputs a corresponding mode signal. Therefore, externally transmitted data can be used to configure the operation mode of the semiconductor integrated circuit.

In accordance with still another exemplary embodiment, the mode determination circuit outputs a mode signal for specifying an operation mode of another externally connected semiconductor integrated circuit. A multi-chip architecture can use the same board to mount the semiconductor integrated circuit mounted with the test circuit and another semiconductor integrated circuit. In the multi-chip architecture, the mode determination circuit can configure operation modes of the other semiconductor integrated circuit.

DETAILED DESCRIPTION OF EXEMPLARY EMBODIMENTS

First Embodiment

Figure 1:
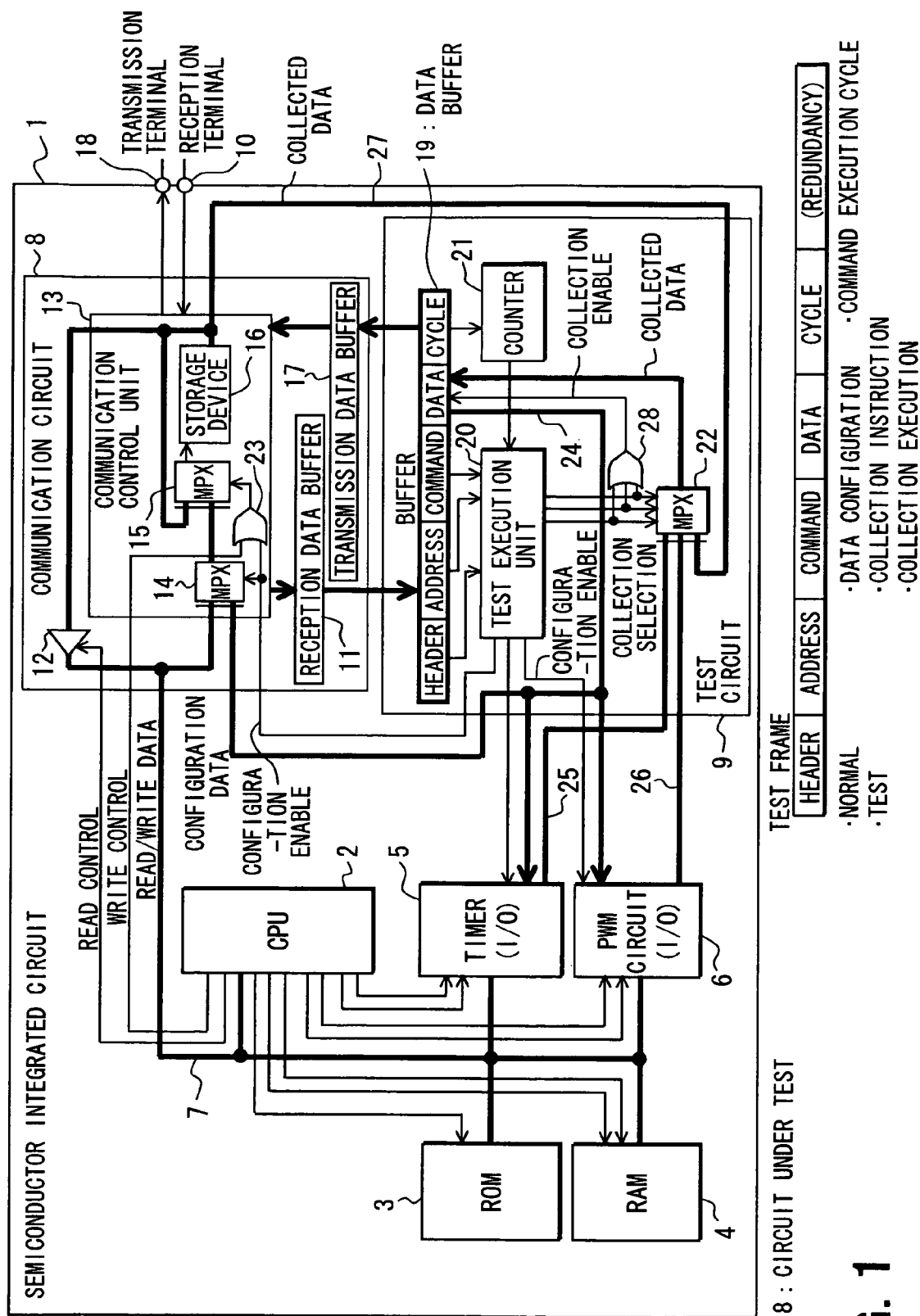
FIG. 1 is a functional block diagram illustrating the construction of a microcomputer according to a first exemplary embodiment.
Figure 2:
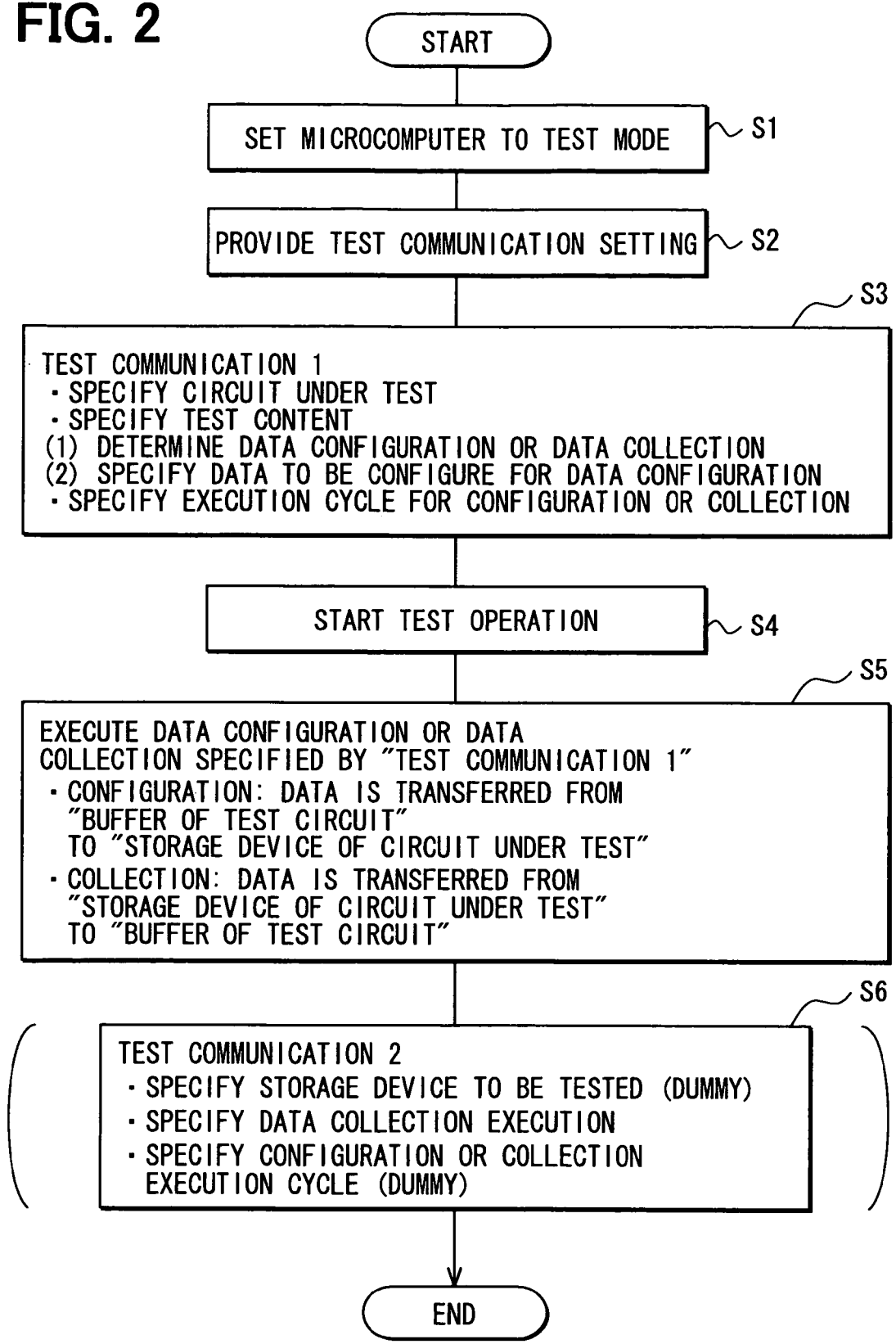
FIG. 2 is a flowchart illustrating an exemplary process for testing a microcomputer function.
Figure 3:
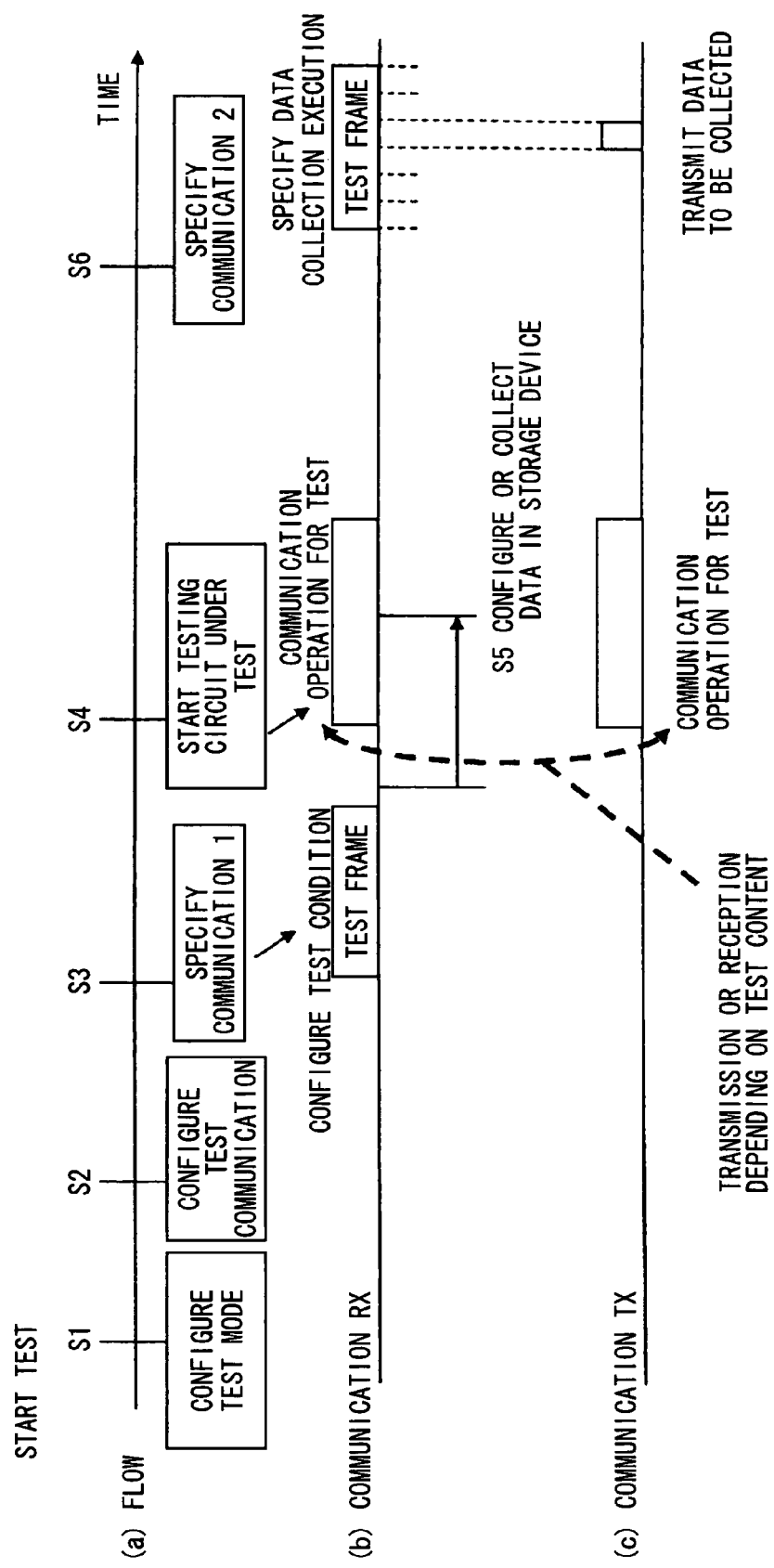
FIG. 3 is a timing diagram illustrating timing associated with the exemplary process shown in FIG. 2.

A first embodiment of the present invention will be described in further detail with reference to FIG. 1 through FIG. 3. FIG. 1 shows the construction of a microcomputer in accordance with a first embodiment of the invention. A microcomputer 1, which can be embodied as a semiconductor integrated circuit, includes a CPU 2 as a main part, memory storage devices such as read-only-memory (ROM) 3 and random-access-memory (RAM) 4, and I/O circuits such as a timer 5 and a pulse width modulation (PWM) circuit 6, all of which can be interconnected through a bus and control signal lines for reading and writing as will be appreciated. Further, the microcomputer 1 includes a communication circuit 8 that complies with in-vehicle LANs such as local interconnect network (LIN) and controller area network (CAN) or general serial communication such as a universal asynchronous receiver transmitter (UART). The communication circuit 8 provides the serial communication with the external source.

The microcomputer 1 also includes a test circuit 9 that collects and configures test data based on data received through the communication circuit 8. The communication circuit 8 receives serial data from the external source through a reception terminal 10. The serial data is converted into parallel data and is stored in reception data buffer 11. The CPU 2 supplies an enable signal such as a read control signal to a transfer gate 12 to read the data stored in the reception data buffer 11.

Data output from the transfer gate 12 is also supplied to a storage device 16 via a multiplexer (MPX) 14 and a MPX 15 in a communication control unit 13. The storage device 16 can be embodied, for example, as a control register or a status register for controlling functions of the communication circuit 8. When the microcomputer 1 transmits data externally, the data is stored in a transmission data buffer 17 and is converted into serial data in the communication control unit 13. The serial data is transmitted to an external source through a transmission terminal 18.

A unit for converting data into serial or parallel data, since well known in the art, is omitted from the drawing. The CPU 2 uses a data path to access the reception data buffer 11 or the transmission data buffer 17 in the communication circuit 8. The data path, since well known, is also omitted from the drawing for simplicity.

The test circuit 9 includes a data buffer 19, a test execution unit 20, a counter 21, and a multiplexer 22. Data is transferred between the data buffer 19 and the reception data buffer 11 or the transmission data buffer 17 in the communication circuit 8 for exchanging test data.

As shown in FIG. 1, a frame of test data, which can be referred to herein as a test frame, contains blocks, segments or portions such as a HEADER portion, an ADDRESS portion, a COMMAND portion, a DATA portion, a CYCLE portion, and a REDUNDANCY portion. The blocks are detailed as follows. The HEADER portion identifies normal operation data for the microcomputer 1 or test data. The ADDRESS portion indicates a data transmission destination address. The COMMAND portion indicates a command for configuring data, specifying data collection, or executing data collection. The DATA portion contains data to be transmitted or received. The CYCLE portion contains data for specifying a time to execute the above-mentioned commands as will be described later. The REDUNDANCY portion contains a check code such as a parity, check sum, or CRC (Cyclic Redundancy Check) code. The REDUNDANCY portion is used for error checking and possibly correction such as for determining the normality or abnormality of communication data contained in the frame. As will be appreciated by one of ordinary skill, the REDUNDANCY portion is not transferred to the data buffer 19.

When no error is found from an error check based on the value of the REDUNDANCY portion, the reception data of the HEADER portion, the ADDRESS portion, and the COMMAND portion, which are stored in the data buffer 19 are supplied to the test execution unit 20. The CYCLE portion is supplied to the counter 21. The test execution unit 20 decodes the ADDRESS portion when the HEADER portion indicates test data. The counter decrements the loaded CYCLE portion data based on a system clock of the microcomputer 21. When the count value reaches "0," the counter 21 issues an enable signal to the test execution unit 20. According to the content of the COMMAND portion the test execution unit 20 issues a configuration enable signal or a collection selection signal to a circuit-under-test indicated by a result of decoding the ADDRESS portion.

According to the embodiment, the test frame is stored in the data buffer 19. When the counter 21 completes decrementing based on the value of the CYCLE portion data thereafter, data about the circuit-under-test is configured or collected.

When the content of the COMMAND portion indicates "data configuration," the configuration enable signal writes data stored in the data buffer 19 to the timer 5, the PWM circuit 6, or the communication circuit 8. The configuration enable signal output to the communication circuit 8 is supplied not only as a switching signal for the multiplexer 14 but also as a switching signal for the multiplexer 15 via an OR gate 23. The other input terminal of the OR gate 23 is supplied with a write control signal from the CPU 2.

A bus 24 for transferring information such as test configuration or test results associated with, for example, the DATA portion stored in the data buffer 19 is connected to the timer 5 and the PWM circuit 6. The bus 24 is connected to one input terminal of the multiplexer 14 in the communication circuit 8.

When the COMMAND content indicates "collection specification," the collection selection signal reads data from the timer 5, the PWM circuit 6, or the communication circuit 8, and stores the data in the data buffer 19 for collection. Data collection buses 25, 26, and 27 are connected to the timer 5, the PWM circuit 6, and the storage device 16 in the communication circuit 8, respectively. The buses are also connected to input terminals of the multiplexer 22 in the test circuit 9. An output terminal of the multiplexer 22 is connected to DATA of the data buffer 19.

The data collection bus 27 connected to the storage device 16 is also connected to an input terminal of the transfer gate 12 and an input terminal of the multiplexer 15. A data path through the input terminal of the multiplexer 15 is used when data is directly configured for the storage device 16 from the external source.

Collection selection signals output from the test execution unit 20 are supplied to the multiplexer 22 as switching signals. The signals are connected to input terminals of a three-input OR gate 28. An output terminal of the OR gate 2 supplies a collection enable signal for DATA in the data buffer 19.

Operations of the present embodiment will now be described with particular reference to FIG. 2 and FIG. 3. FIG. 2 is a flowchart showing a process for testing functions by connecting a test device such as a large scale integration (LSI) tester to the microcomputer 1 through the communication circuit 8. FIG. 3 shows exemplary timing corresponding to the process. The process allows the test device to enable test mode as the operation mode for the microcomputer, for example, at S1. The process provides test communication settings such as a communication rate and a communication procedure for the control register, such as storage device 16, of the communication circuit 8 at S2.

The process configures the test frame for performing "test communication 1" at S3. Data values are allocated to the HEADER portion, the ADDRESS portion, the COMMAND portion, the DATA portion, the CYCLE portion, and the REDUNDANCY portion in accordance with a circuit to be tested, a test content such as a configuration or collected test data, and a time interval elapsed before starting the data configuration or collection as mentioned above. The test frame is transmitted to the microcomputer 1.

In the microcomputer 1, the test frame is stored in the data buffer 19 of the test circuit 9 via the communication circuit 8. The process starts testing a circuit-under-test or a circuit to be inspected at S4. When the test device transmits the test frame, the communication circuit 8 starts a reception operation as shown, for example, in FIG. 3B. When the data buffer 19 stores the test frame, the value of the ADDRESS portion indicates, for example, an address of the storage device 16, such as an address or identification of one of the registers of the communication circuit 8. It is assumed that the value of the COMMAND portion specifies "data configuration."

The value of the CYCLE portion data in the test frame is loaded into the counter 21, which begins decrementing the count value. When the count value reaches "0," the test execution unit 20 activates the configuration enable signal for the communication circuit 8. The contents of the DATA portion in the test frame is transferred across bus 24, and passes through the MPX 14 and MPX 15, and is written to the storage device 16.

The communication circuit 8 starts a communication operation when receiving the test frame. When the count value of the counter 21 reaches "0" during the operation, the contents of the DATA portion in the test frame is written to the storage device 16 during the communication operation. When the communication circuit 8 is performing the reception, a process result determines status such as "normal reception" or "error." When the DATA portion is allocated to the storage device 16 during the operation, the test can be used to determine whether or not the communication circuit 8 operates appropriately.

The communication circuit 8 is tested variously. One example is to change the communication time per bit during the communication. Another example is to change the communication data length from 16 bits to eight bits. The test can perform irregular operations that are not expected to occur as normal operations. The test also confirms whether or not the REDUNDANCY block correctly reflects a result of the irregular operation such as an error result in the contents of the test frame.

When the COMMAND portion specifies "data collection," the count value of the counter 21 reaches "0" at S5 during the transmission to the communication circuit 8. The test execution unit 10 then outputs a collection enable signal. Data stored in the storage device 16 passes through the data collection bus 27 and the multiplexer 22 and is transferred to the data buffer 19.

When the contents of the COMMAND portion are transmitted as "data collection" during "test communication 1," for example in connection with S6, the following steps can be performed. When DATA is transferred to the data buffer 19 and is stored there, the test device collects DATA via the communication circuit 8. In the above described case, "dummy" data is allocated because ADDRESS and CYCLE portions need not be specified in the test frame. When the test frame is received, the content of the data buffer 19 is transferred to the transmission data buffer 17 of the communication circuit 8. The data is transmitted to the test device via a transmission terminal (TX) 18 as shown, for example, in FIG. 3C.

In the microcomputer 1 according to the embodiment, the communication circuit 8 receives data and transfers it to the data buffer 19. Of the transferred data, the HEADER, ADDRESS, and COMMAND portions are transferred to the test execution unit 20 of the test circuit 9. The counter 21 is allocated with the contents of the CYCLE portion of the transferred data and starts the count operation based on count value and the operation of the system clock.

In an exemplary scenario, the HEADER portion indicates that the transferred data is "test data" and the COMMAND portion indicates a command named "data collection specification." When the counter 21 completes the count operation, the test execution unit 20 outputs a decode result based on the value of the ADDRESS portion operating as a collection enable signal to the circuit-under-test. When supplied with the collection enable signal, the transmission data buffer 17 stores the data transferred from the circuit-under-test. When the counter 21 is supplied with appropriately configured CYCLE data, the transmission data buffer 17 can store data that reflects operation states at various times of the circuit-under-test.

When the value of the COMMAND portion indicates "data collection execution," the test execution unit 20 transmits data stored in the transmission data buffer 17 to the communication circuit 8. The test device can acquire the data via the communication circuit 8. Let us suppose that the COMMAND portion indicates a "data configuration" command. When the counter 21 completes the count operation, the test execution unit 20 outputs a decode result based on the value of the ADDRESS portion as a configuration enable signal to the circuit-under-test. The test execution unit 20 outputs the content of DATA portion in the transferred data to the circuit-under-test. When the counter 21 is supplied with appropriately configured CYCLE data, data can be configured at various times.

The communication circuit 8 can be selected as a circuit-under-test. Functions of the communication circuit 8 can be tested by acquiring data from or transferring configuration data thereto. In addition, the test circuit 9 is constructed independently of the communication circuit 8. While the communication circuit 8 is performing communication not directly related to the test, the test circuit 9 can acquire test data at any time.

Second Embodiment

Figure 4:
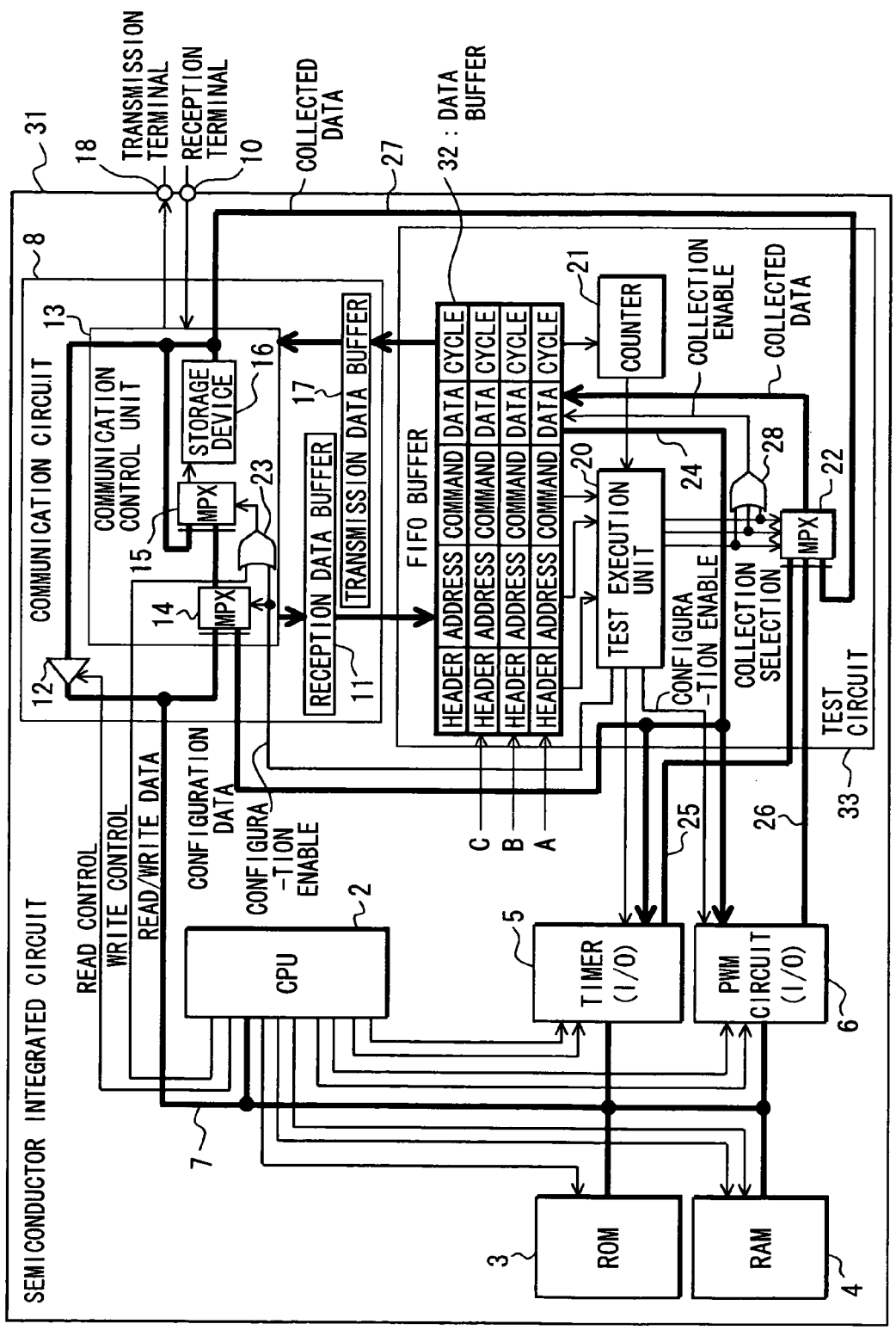
FIG. 4 is a functional block diagram illustrating a second exemplary embodiment.
Figure 5:
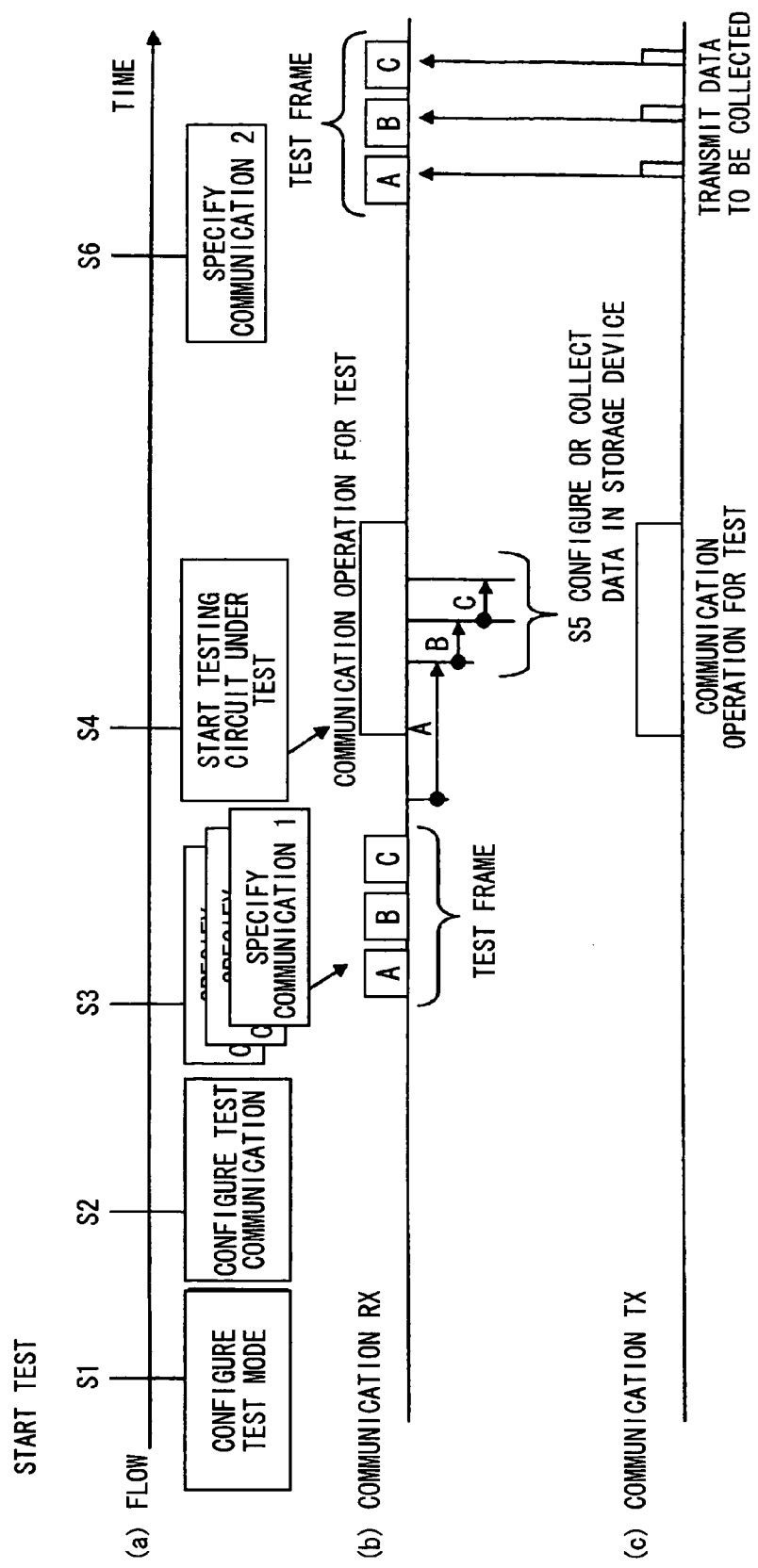
FIG. 5 is a timing diagram further illustrating timing associated with the exemplary process in FIG. 2.

FIG. 4 and FIG. 5 show a second embodiment of the invention. The mutually corresponding parts in the first and second embodiments are designated by the same reference numerals and a description thereof is omitted for simplicity. According to the second embodiment, a microcomputer 31 embodied, for example, as semiconductor integrated circuit, uses a test circuit 33 including a data buffer such as a FIFO 32 in place of the test circuit 9 including the data buffer 17. The other constructions can be the same as the first embodiment.

Operations in accordance with the second embodiment will be described with reference to FIG. 5. Since the second embodiment provides the FIFO 32, multiple test frames can be successively transmitted during the communication at S3 in FIG. 2 and sequentially stored in the FIFO 32. Of the test frames stored in the FIFO 32, the COMMAND and CYCLE portions in frame A are first transferred to the test execution unit 20 and the counter 21. When counting, as indicated by the contents of the CYCLE portion in frame A, terminates, data is allocated to the storage device 16.

At the time the counter 21 terminates the count operation, the process outputs a request for transferring the next frame B to the FIFO 32. The COMMAND and CYCLE portions in frame B are transferred to the test execution unit 20 and the counter 21 and a handshake process is performed therebetween. When counting the CYCLE data in frame B terminates after frame B is transferred, the next DATA is allocated to the storage device 16. The next frame C is processed similarly.

Let us suppose that COMMAND indicates "data collection specification." When frames A, B, and C are sequentially processed as mentioned above, DATA collected from the storage device 16 is sequentially transferred to an unused area in the FIFO 32. When "data collection execution" is transmitted during test communication 2 at S6, frames A, B, and C stored in FIFO 32 are sequentially transmitted to the test device.

As mentioned above, the second embodiment uses the FIFO 32 as the data buffer of the test circuit 33. It is possible to successively acquire multiple pieces of data from a circuit-under-test or successively allocate multiple pieces of data to the circuit-under-test. The test efficiency can be improved.

Third Embodiment

Figure 6:
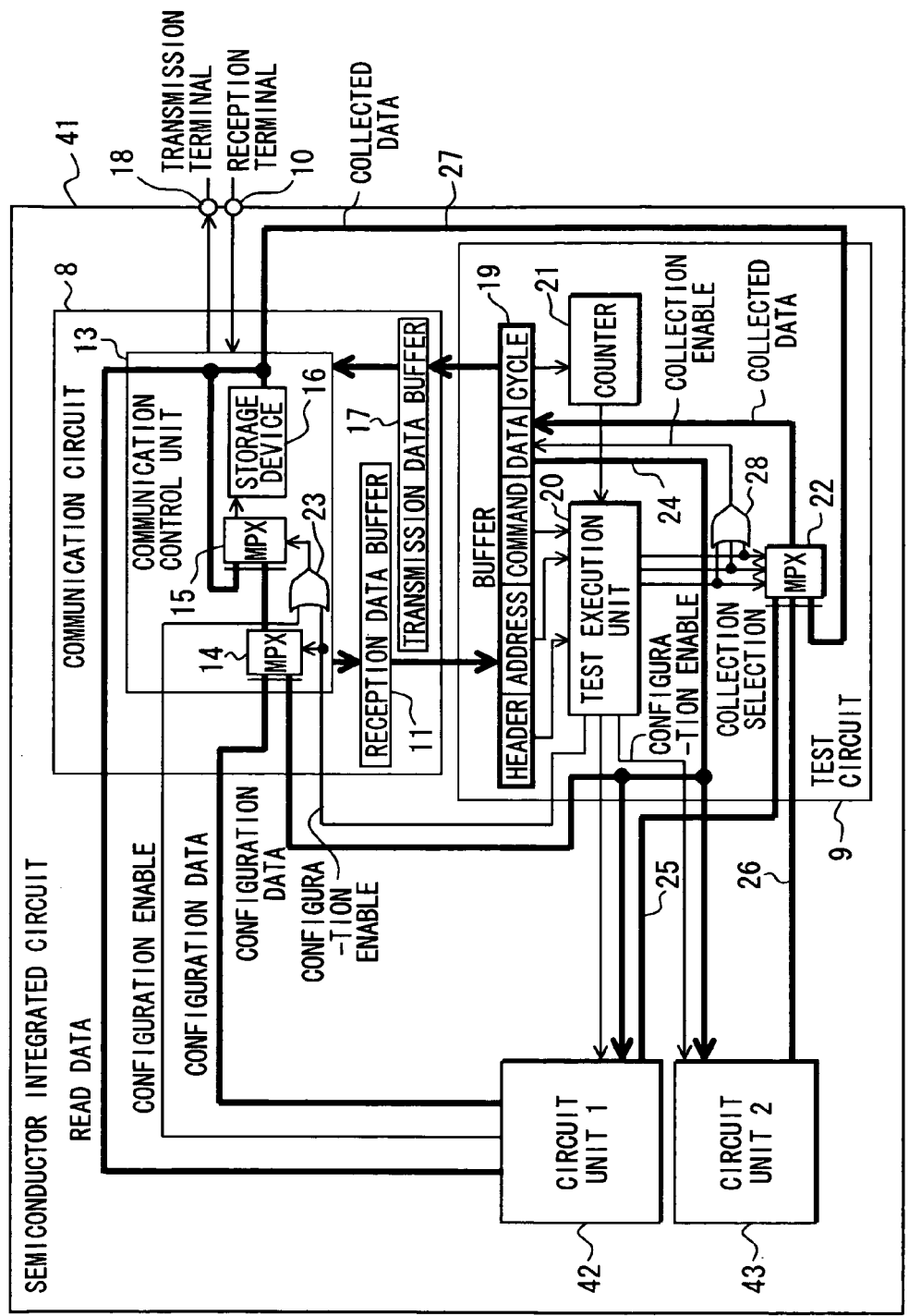
FIG. 6 is a functional block diagram illustrating an exemplary construction of a custom logic circuit in accordance with a third embodiment.

A third embodiment will now be described, for example, in connection with FIG. 6. It will be appreciated that the following description will focus primarily on differences between the present embodiment and the first embodiment. In accordance with the third embodiment, a custom logic circuit 41, such as an application specific integrated circuit (ASIC), semiconductor integrated circuit, logic array, gate array or the like, having no CPU can be provided. The custom logic circuit 41 includes circuit units 42 and 43 that represent a sequencer and a gate array including a state machine or a register, for example. The circuit units 42 and 43 are laid out so as to replace the timer 5 and the PWM circuit 6 of the first embodiment. An internal logic of the circuit unit 42 controls the communication circuit 8. The test circuit 9 is used to configure or collect data for internal registers of the circuit units 42 and 43.

In accordance with the custom logic circuit 41 of the third embodiment, the communication circuit 8 and the test circuit 9 can be used to apply various patterns of tests to a circuit that has no CPU, however, it will be appreciated that such a configuration can not perform a test, for example, by supplying a CPU with a test instruction.

Fourth Embodiment

Figure 7:
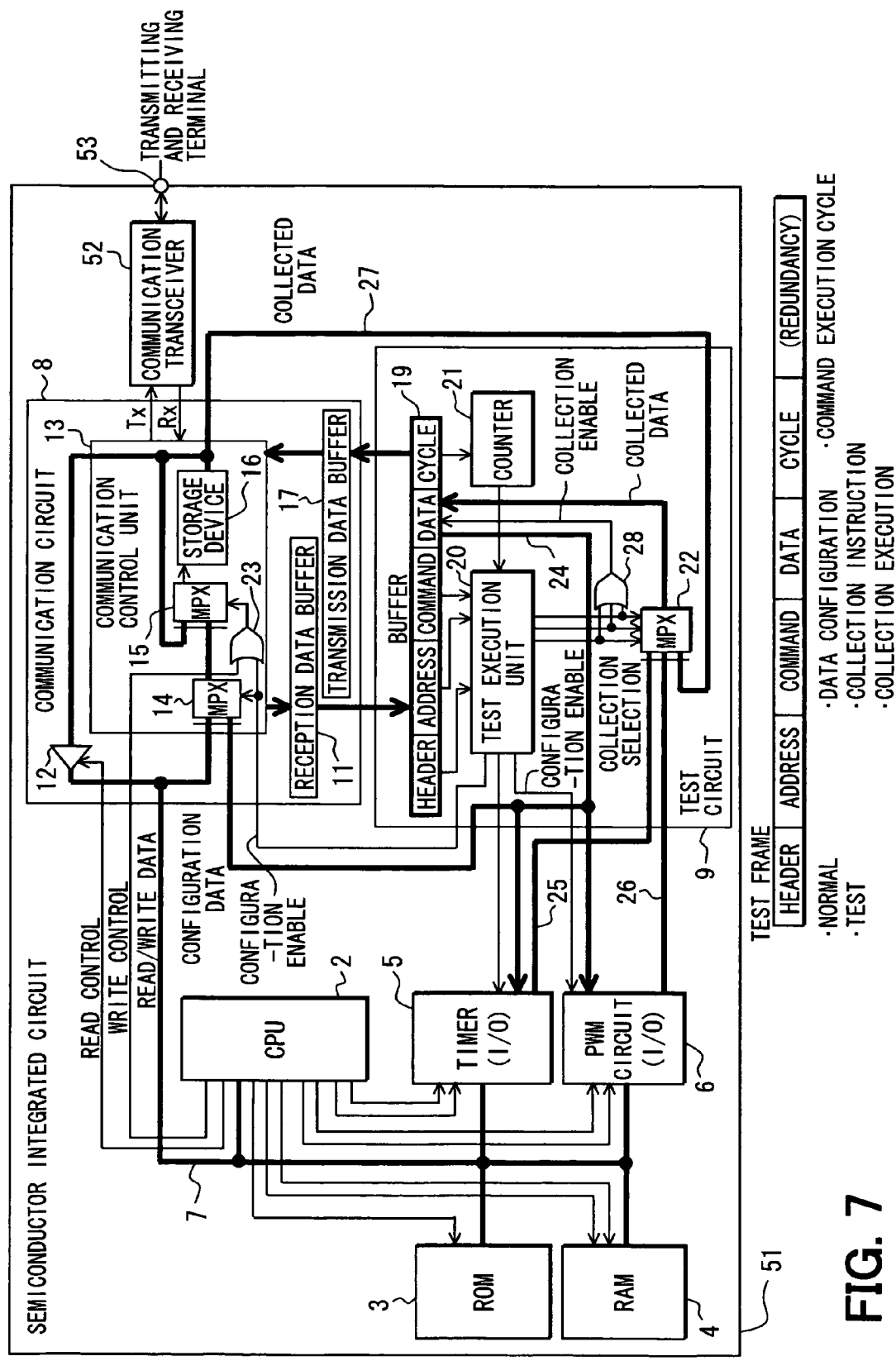
FIG. 7 is a functional block diagram illustrating an exemplary construction of a microcomputer in accordance with a fourth embodiment.

A fourth embodiment will now be described, for example, in connection with FIG. 7 and FIG. 8. It will be appreciated that the following description will focus primarily on differences between the present embodiment and the first embodiment. In accordance with the fourth exemplary embodiment, a microcomputer 51, which can be embodied as a semiconductor integrated circuit includes a communication transceiver 52 between the communication circuit 8 and an external source. The communication transceiver 52 performs bidirectional communication between the communication circuit 8 and an external source using a common signal line such as a communication bus, or the like. The communication transceiver 52 is connected to an external bus via a transmitting and receiving terminal 53. The communication transceiver 52 is connected to the communication circuit 8 through a reception signal line RX and a transmission signal line TX. The transmitting and receiving terminal 53 is connected to only one signal line as the communication bus.

Figure 8:
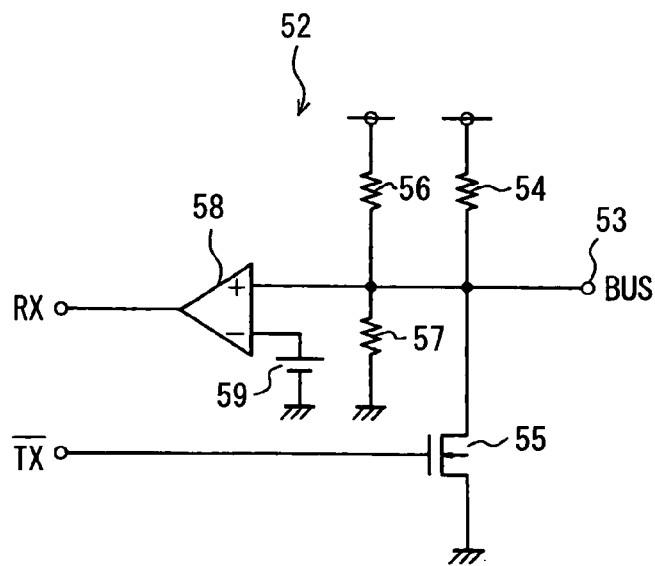
FIG. 8 is a diagram illustrating an exemplary construction of a communication transceiver.

FIG. 8 shows an exemplary construction of the communication transceiver 52. Two series circuits are connected between a power supply and the ground. One includes a resistance element 54 and an N-channel MOSFET 55. The other includes resistance elements 56 and 57. The series circuits are connected in common to an external bus via the transmitting and receiving terminal 53. The gate of the FET 55 is supplied with a transmission signal TX having, for example, a negative active logic, from the communication circuit 8.

The resistance elements 56 and 57 are in common connected to a non-inverting input terminal of a comparator 58. An inverting input terminal of the comparator 58 is supplied with a reference voltage 59 for reception signal level comparison. An output terminal of the comparator 58 supplies a reception signal RX to the communication circuit 8.

The resistance elements 56 and 57 divide a voltage of a signal that is transmitted from an external source and is received by the microcomputer 51. The comparator 58 compares the divided voltage with the reference voltage 59. A comparison result is output as the reception signal RX to the communication circuit 8. When the communication circuit 8 transmits a signal TX to the external source, the signal is supplied as a gate signal for the FET 55. When the signal TX goes low, the FET 55 turns off to raise the communication bus level toward the power supply voltage level. When the signal TX goes high, the FET 55 turns on to lower the communication bus level toward the ground level.

As mentioned above, the fourth embodiment provides the communication transceiver 52 that uses the common signal line to transmit and receive data when the communication circuit 8 performs serial communication with an external source. It is possible to reduce a signal line for the microcomputer 1 to perform the bidirectional communication. The communication transceiver 52 is constructed so as to use one signal line for the serial communication with an external source. The number of signal lines can be minimized.

Fifth Embodiment

A fifth embodiment will now be described, for example, in connection with FIG. 9 through FIG. 11. It will be appreciated that the following description will focus primarily on differences between the present embodiment and the first embodiment. A microcomputer 61, which can be embodied as a semiconductor integrated circuit, according to the fifth embodiment includes a test circuit 62 in place of the test circuit 9. The test circuit 62 includes a mode determination circuit 63 and includes the functions of the test circuit 9 according to the first embodiment. It should be noted that only functions added in accordance with the fifth embodiment are shown in the relevant figures for simplicity.

The mode determination circuit 63 is connected to the data buffer 19 and references a HEADER portion and a MODE portion in a received data frame. The HEADER portion can contain a value associated with a "mode configuration" in addition to "normal" and "test" described in the first embodiment. When HEADER indicates "mode configuration," the MODE portion can contain configuration data that corresponds to any of the other portions in the received data frame, such as the ADDRESS portion, the COMMAND portion, and the DATA portion.

When the HEADER portion indicates "mode configuration," the mode determination circuit 63 acquires data associated with the MODE portion, decodes the acquired data, and outputs various mode signals. For example, mode signals can include "single," "test," and "ICE." "Single" corresponds to a normal operation mode of the microcomputer 61. "Test" corresponds to a test mode using the test circuit 62. "ICE" corresponds to a debug mode using an ICE (In Circuit Emulator). Of course, other modes are possible.

The "multi-test" mode can be used for a multi-chip architecture where the microcomputer 61 is mounted on the same board as the other peripheral circuit chips. "Multi-test" corresponds to a mode that controls states of the other chips for testing the microcomputer 61. Accordingly, it will be appreciated that the "test" mode and the "multi-test" mode may be active simultaneously.

Figure 10:
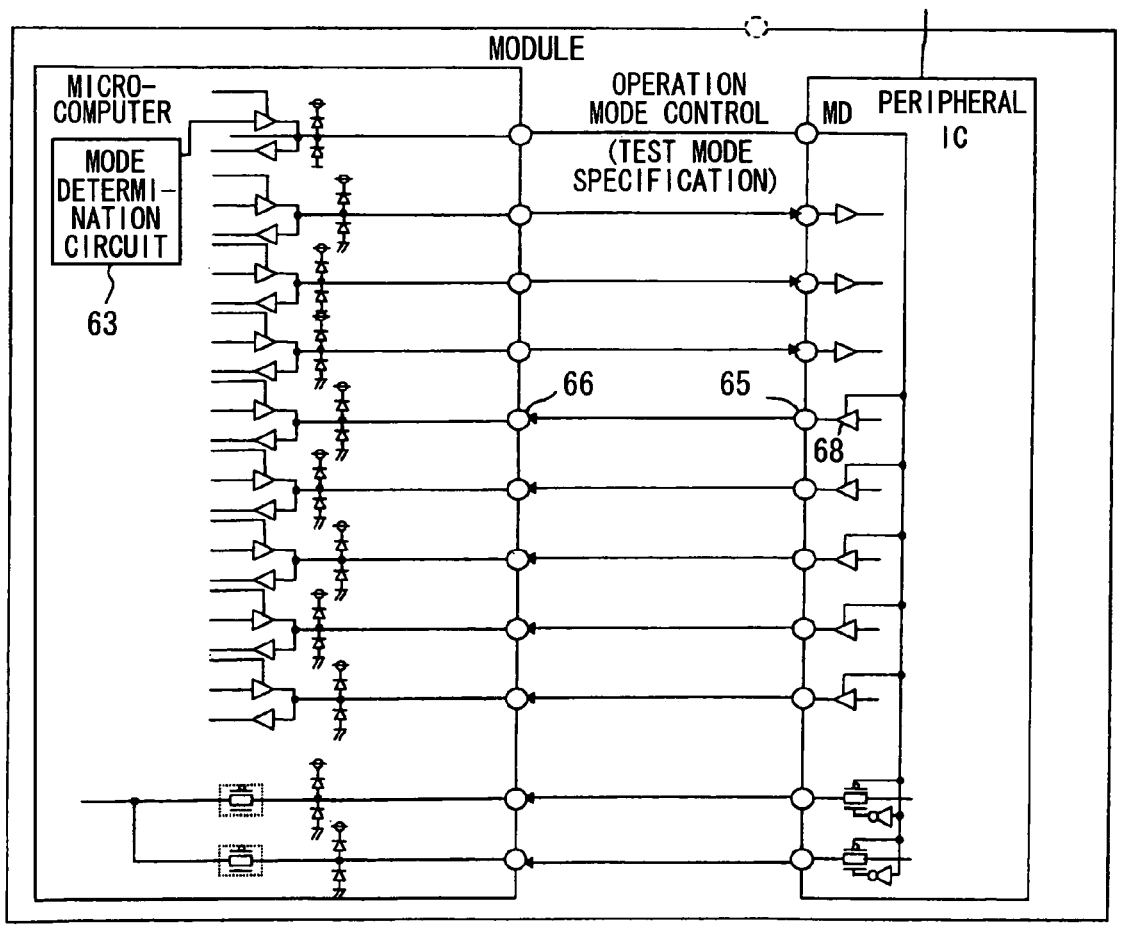
FIG. 10 is a diagram illustrating an exemplary test configuration between a microcomputer and peripheral circuits in accordance with a multi-chip construction.

FIG. 10 shows an example of performing a test between the microcomputer 61 and a peripheral IC 64 as another peripheral circuit according to the multi-chip architecture. The peripheral IC 64 represents a driver, for example. The peripheral IC 64 converts a level of a signal that is input and output between the microcomputer 61 and an external source. The peripheral IC 64 also supplies a source current needed for driving an external bus or a load and absorbs a sink current.

Figure 11:
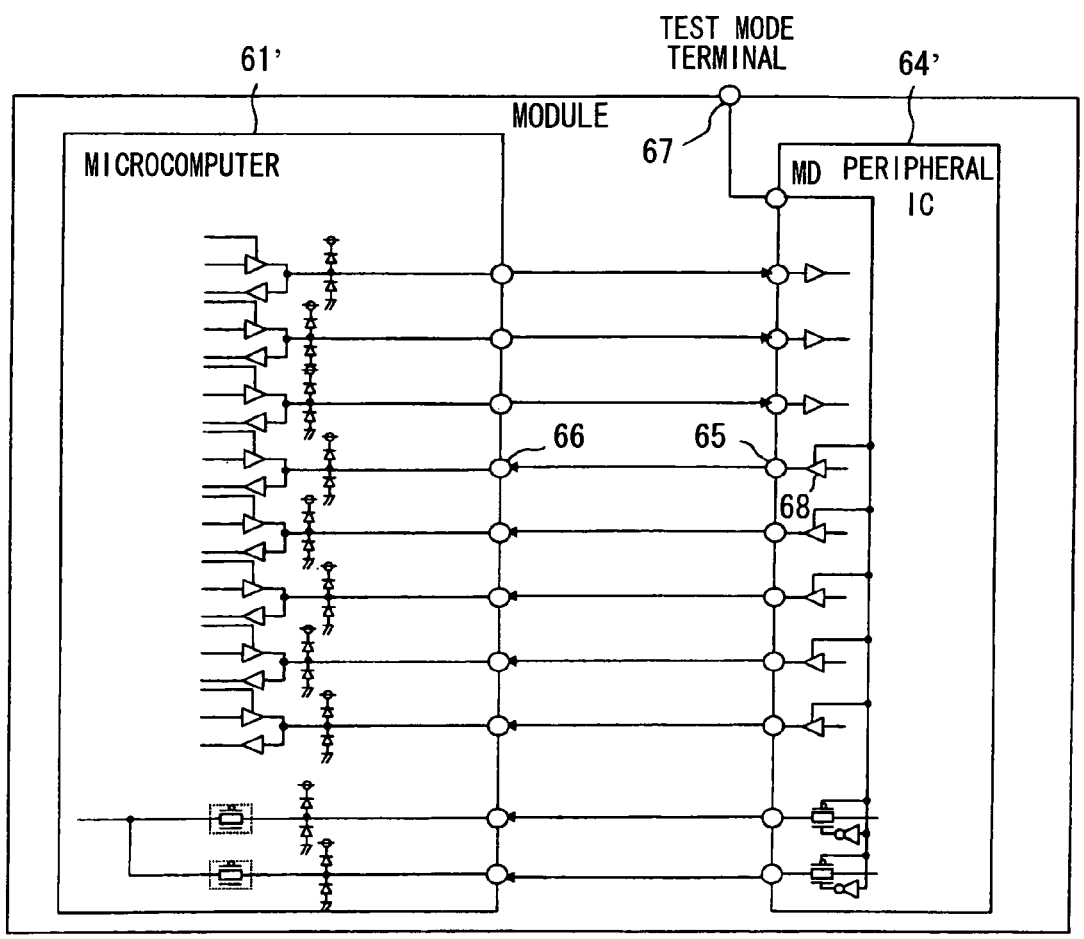
FIG. 11 is a diagram illustrating an exemplary conventional construction between a microcomputer and peripheral circuits.

FIG. 11 shows a conventional construction corresponding to FIG. 10. Let us suppose that an output terminal 65 of the peripheral IC 64 is connected to an input/output terminal 66 of the microcomputer 61. To test the input/output terminal 66 of the microcomputer 61, the output terminal 65 of the peripheral IC 64 may need to be set to a high impedance. Accordingly, a three-state buffer 68 corresponding to the output terminal 65 needs to be set to a high impedance. Further according to the conventional construction as shown in FIG. 11, a peripheral IC 64 needs to be set to a test mode by providing an external terminal, such as a test mode terminal 67 and configuring a level such as a signal level to be applied to the test mode terminal 67 from, for example, an external source.

Figure 9:
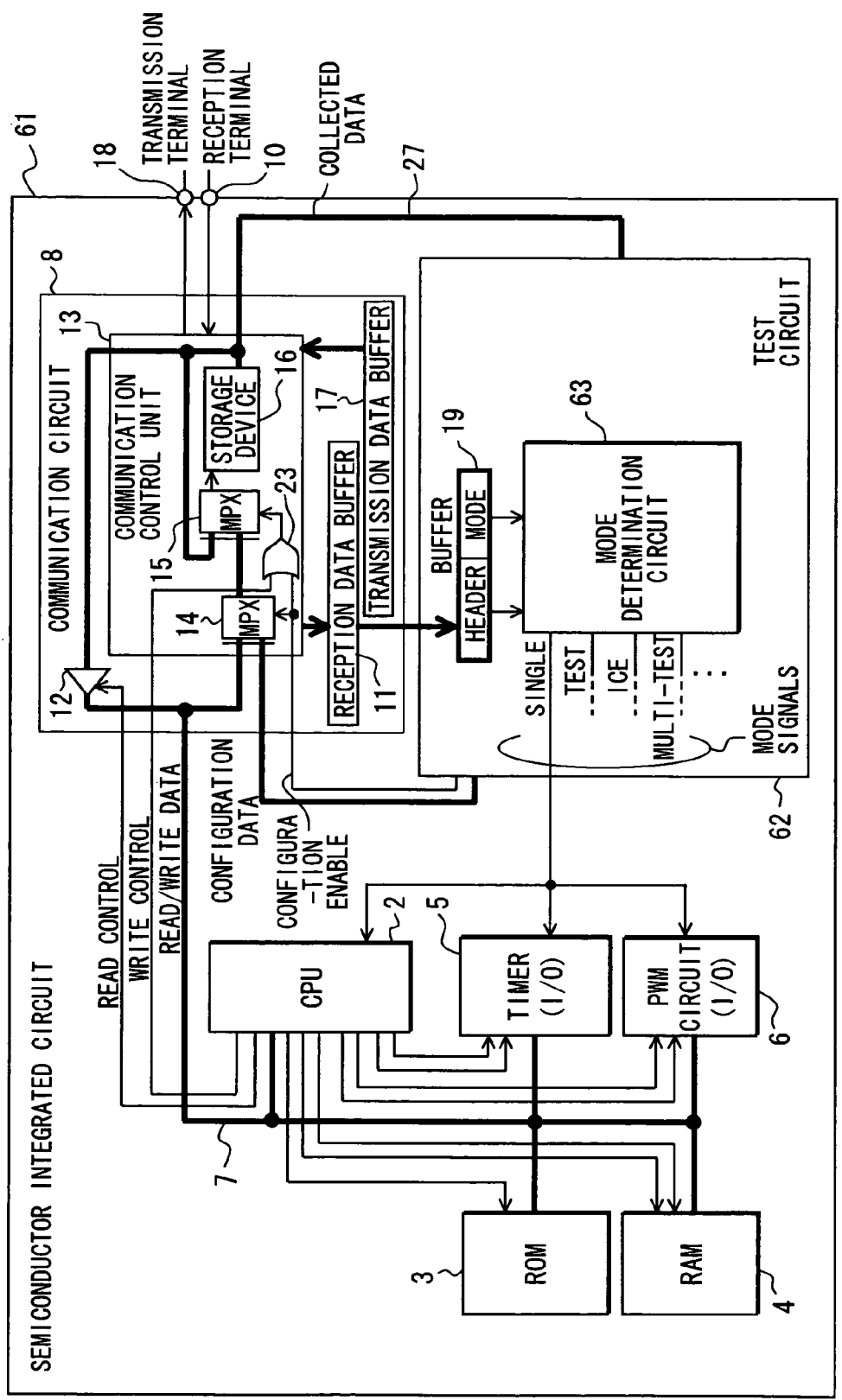
FIG. 9 is a functional block diagram illustrating an exemplary construction of a microcomputer in accordance with a fifth embodiment.

In contrast however, in the exemplary construction according to the fifth embodiment, the mode determination circuit 63 of the microcomputer 61 supplies the peripheral IC 64 with a signal for specifying a test mode such as a "multi-test" mode illustrated in FIG. 9 via a wiring 69 between chips. The three-state buffer 68 can be set to a high-impedance state and the test mode terminal 67 can be advantageously eliminated.

When, according to the fifth embodiment, the HEADER portion in the received data indicates "mode configuration," the test circuit 62 outputs the mode configuration DATA portion in the received data frame to the mode determination circuit 63. The mode determination circuit decodes the supplied data and outputs a corresponding mode signal. Therefore, externally transmitted data can be used to configure the operation mode of the microcomputer 61.

The mode determination circuit 62 also outputs a mode signal for specifying operation mode of the peripheral IC 64 externally connected to the microcomputer 61. The multi-chip architecture is capable of configuring operation mode of the peripheral IC 64.

(Modifications)

It should be understood that the present invention is not limited to the above-mentioned embodiments and the accompanying drawings but may be modified as follows. In accordance with the first and second embodiments, the timer 5, the PWM circuit 6, and the storage device 16 may be tested. The FIFO 32 of the second embodiment may be applied to the exemplary construction in accordance with the third embodiment. The communication circuit 8 may be specified as a circuit-under-test according to need. The test circuit may be constructed to perform only "data collection." The fourth embodiment may be combined with the fifth embodiment.

It will further be appreciated that the circuit-under-test is not limited to any one or a combination of the timer 5, the PWM circuit 6, or the communication circuit 8, but may also include, for example, a free running counter and other circuits to be mounted in accordance with functions needed for semiconductor integrated circuit testing according to need.

The construction of the communication transceiver is not limited to that shown in FIG. 8. The communication transceiver may use two or more signal lines for serial communication with an external source. In operation modes for the other circuits according to the fifth embodiment, an output signal level may be set to be high or low. When a constant current circuit is contained, a current output may be stopped, a clock frequency may be changed, or a clock output may be stopped according to the operation modes. The invention may be applied to a multi-chip architecture that contains two or more peripheral circuits for the microcomputer 61. The other circuits may include the CPU or the microcomputer. When the multi-chip architecture is not used in accordance with the fifth embodiment, the mode signal is output by the determination circuit 63 only internally to the microcomputer 61.

What is claimed is:

1. A semiconductor integrated circuit comprising:
a communication circuit conducting serial communication with an external source; and
a test circuit that collects data for testing an internal function from a circuit-under-test based on data received via the communication circuit, wherein
a frame of the received data includes at least a HEADER data portion, an ADDRESS data portion, a COMMAND data portion, a DATA data portion, a CYCLE data portion, and a REDUNDANCY data portion;
the test circuit includes:
a data buffer that stores data received and transferred by the communication circuit, the data buffer capable of transferring the stored data to the communication circuit;
a test execution unit that is supplied with the HEADER data portion, the ADDRESS data portion, and the COMMAND data portion transferred from the data buffer; and
a counter that is supplied with a count value corresponding to the CYCLE data portion transferred from the data buffer and begins a count operation based on a system clock when the CYCLE data portion is transferred;
the test execution unit, upon completion of the count operation, outputs a decode result to the circuit-under-test based on the ADDRESS data portion when the HEADER data portion indicates that the contents of the DATA data portion includes test data and the COMMAND data portion includes a data collection command;
the data buffer is supplied with the ADDRESS data portion so as to store data transferred from the circuit-under-test;
the test circuit further includes a mode determination circuit configured to output a mode signal for specifying an operation mode of the semiconductor integrated circuit, the test circuit mounted on the semiconductor integrated circuit and supplying the mode determination circuit with mode configuration data allocated to a portion other than the HEADER portion of the frame of the received data when the HEADER portion specifies the transfer data as mode configuration data;
the mode determination circuit is further configured to decode the mode configuration data and output a corresponding mode signal; and
the mode determination circuit outputs a mode signal for specifying an operation mode of another externally connected semiconductor integrated circuit.

2. The semiconductor integrated circuit of claim 1, wherein the test execution unit transfers data stored in the data buffer to the communication circuit when the COMMAND data portion includes the data collection command.

3. The semiconductor integrated circuit of claim 1, wherein the test execution unit outputs the decode result based on the ADDRESS data portion to the circuit-under-test and outputs the DATA data portion to the circuit-under-test for configuration when the COMMAND data portion includes a data configuration command.

4. The semiconductor integrated circuit of claim 1, wherein the circuit-under-test includes the communication circuit.

5. The semiconductor integrated circuit of claim 1, wherein the data buffer of the test circuit includes a first-in-first-out (FIFO) construction.

6. The semiconductor integrated circuit of claim 1, further comprising:
a communication transceiver coupled to the communication circuit, the communication transceiver capable of being coupled to the external source with a common signal line, the communication transceiver configured to transmit and receive data to and from the communication circuit and to perform the serial communication with the external source using the common signal line.

7. A semiconductor integrated circuit comprising:
a communication circuit;
a circuit-under-test coupled to the communication circuit; and
a test circuit coupled to the communication circuit and the circuit-under-test, the test circuit for testing an internal function of the circuit-under-test based on a serial communication of data between the communication circuit and an external source a communication circuit, wherein
a frame of received data, which is received through the serial communication, includes an ADDRESS data portion and a CYCLE data portion;
the test circuit includes:
a data buffer that stores the data associated with the testing, the data transferred to and from the external source;
a counter supplied with a count value associated with the CYCLE data portion, the counter configured to begin a count operation based on a system clock when the CYCLE data portion is transferred; and
a test execution unit that, upon completion of the count operation, interacts with the circuit-under-test based on a decoded value associated with the ADDRESS data portion when one of a test data collection command and a test configuration command are indicated by the contents of the frame;
the data buffer is supplied with the ADDRESS data portion so as to store data transferred from the circuit-under-test when the one is the test data collection command
the test circuit further includes a mode determination circuit configured to output a mode signal for specifying an operation mode of the semiconductor integrated circuit; and
the mode determination circuit outputs a mode signal for specifying an operation mode of another externally connected semiconductor integrated circuit.

8. The semiconductor integrated circuit of claim 7, wherein the received data further includes a COMMAND data portion, and wherein the test execution unit transfers data stored in the data buffer to the communication circuit when the COMMAND data portion includes the test data collection command.

9. The semiconductor integrated circuit of claim 7, wherein the received data further includes a DATA data portion, and wherein the test execution unit further outputs the contents of the DATA data portion to the circuit-under-test when the one is the test configuration command.

10. The semiconductor integrated circuit of claim 7, further comprising:
a communication transceiver coupled to the communication circuit, the communication transceiver capable of being coupled to the external source with a common signal line, the communication transceiver configured to transmit and receive data to and from the communication circuit and to perform the serial communication with the external source using the common signal line.

11. The semiconductor integrated circuit of claim 7, wherein the frame of the received data further includes a REDUNDANCY data portion containing a value for determining whether one or more errors are present in the frame.

12. The semiconductor integrated circuit of claim 7, wherein the test circuit includes a separate circuit mounted on the semiconductor integrated circuit.

13. The semiconductor integrated circuit of claim 7, wherein
the test circuit supplies mode configuration data to the mode determination circuit, the mode configuration data allocated to a portion of the frame when the one is the test configuration command; and
the mode determination circuit is further configured to decode the mode configuration data and output a corresponding mode signal.

* * * * *